(12) United States Patent
Sethumadhavan et al.

(10) Patent No.: US 7,180,172 B2
(45) Date of Patent: Feb. 20, 2007

(54) CIRCUITS, MULTI-LAYER CIRCUITS, AND METHODS OF MANUFACTURE THEREOF

(75) Inventors: Murali Sethumadhavan, Shrewsbury, MA (US); Scott D. Kennedy, Canterbury, CT (US); Carlos L. Barton, Brooklyn, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 10/873,405

(22) Filed: Jun. 21, 2004

(65) Prior Publication Data

US 2004/0262739 A1    Dec. 30, 2004

Related U.S. Application Data

(60) Provisional application No. 60/480,111, filed on Jun. 19, 2003.

(51) Int. Cl.
*H01L 23/14* (2006.01)
(52) U.S. Cl. ........................ 257/702; 174/255
(58) Field of Classification Search ........... 257/702; 174/255
See application file for complete search history.

(56) References Cited

U.S. PATENT DOCUMENTS

| | | | |
|---|---|---|---|
| 4,737,398 A | 4/1988 | Ikenaga et al. | |
| 4,802,061 A | 1/1989 | Portugall et al. | |
| 4,871,595 A | 10/1989 | Lusignea et al. | |
| 4,876,120 A | 10/1989 | Belke et al. | |
| 4,904,752 A | 2/1990 | Kanoe et al. | |
| 4,910,077 A | 3/1990 | Benedikt | |
| 4,963,428 A | 10/1990 | Harvey et al. | |
| 4,966,806 A | 10/1990 | Lusignea et al. | |
| 4,966,807 A | 10/1990 | Harvey et al. | |
| 4,975,312 A | 12/1990 | Lusignea et al. | |
| 5,079,289 A | 1/1992 | Layton et al. | |
| 5,147,967 A | 9/1992 | Stern et al. | |
| 5,164,458 A | 11/1992 | Jennings et al. | |
| 5,216,092 A | 6/1993 | Huspeni et al. | |
| 5,288,529 A | 2/1994 | Harvey et al. | |
| 5,360,647 A | 11/1994 | Sumida | |
| 5,484,867 A | 1/1996 | Lichtenhan et al. | |
| 5,529,740 A | 6/1996 | Jester et al. | |
| 5,703,202 A | 12/1997 | Jester et al. | |
| 5,719,354 A | 2/1998 | Jester et al. | |
| 5,847,039 A | 12/1998 | Nagashima et al. | |

(Continued)

FOREIGN PATENT DOCUMENTS

CA    2 273 542    12/1999

(Continued)

OTHER PUBLICATIONS

JP 2002317112; Publication Date Oct. 31, 2002 (translation of abstract only).

(Continued)

*Primary Examiner*—Sara Crane
(74) *Attorney, Agent, or Firm*—Cantor Colburn LLP

(57) ABSTRACT

A dielectric material for use in a circuit material comprises a liquid crystalline polymer and a polyhedral oligomeric silsesquioxane (POSS) filler. Such dielectric materials may provide a variety of advantageous properties, especially in high frequency circuits.

12 Claims, 1 Drawing Sheet

U.S. PATENT DOCUMENTS

| | | | |
|---|---|---|---|
| 5,900,292 | A | 5/1999 | Moriya |
| 6,027,771 | A | 2/2000 | Moriya |
| 6,124,004 | A | 9/2000 | Furuta et al. |
| 6,472,076 | B1 | 10/2002 | Hacker |
| 6,623,711 | B2 | 9/2003 | Lyu et al. |
| 6,716,919 | B2 | 4/2004 | Lichtenhan et al. |
| 2002/0074158 | A1 | 6/2002 | St. Lawrence et al. |
| 2002/0076538 | A1 | 6/2002 | St. Lawrence et al. |
| 2002/0193533 | A1 | 12/2002 | Kamo et al. |
| 2004/0262739 | A1 | 12/2004 | Sethumadhavan et al. |

FOREIGN PATENT DOCUMENTS

| | | |
|---|---|---|
| EP | 0 697 278 B1 | 2/1996 |
| EP | 1 271 634 A2 | 1/2003 |
| JP | 06-252555 | 9/1994 |
| JP | 2001-244630 | 9/2001 |
| WO | WO 2005/004220 | 1/2005 |

OTHER PUBLICATIONS

Haddad, Timothy S. et al "Hybrid Organic-Inorganic Thermoplastics: Styryl-Based Polyhedral Oligomeric Silsesquioxane Polymers" Macrocolecules, American Chemical Society (1996), vol. 29, No. 22, pp. 7302-7304.

Lichtenhan, Joseph D. et al, "Silsesquioxane-Siloxane Copolymers from Polyhedral Silsesquioxanes" Macromolecules, American Chemical Society (1993), vol. 26, No. 8, pp. 2141-2142.

Lichtenhan, Joseph D. et al, "Linear Hybrid Plymer Building Blocks: Methacrylate-Functionalized Polyhedral Oligomeric Silsesquioxane Monomers and Polymers", Macromoleules, American Chemical Society (1995), vol. 28, No. 24, pp. 8435-8437.

Tsuchida, Akira et al, "Ethene and Propene Copolymers Containing Silsesquioxane Side Groups", Macromolecules, American Chemical Society (1997), vol. 30, No. 10, pp. 2818-2824.

International Search Report PCT/US2004/020183; Mailing Date Nov. 4, 2004.

Written Opinion International Application No. PCT/US2004/020183; Mailing Date Nov. 4, 2004.

JP 06-252555; Sep. 9, 2004 (translation of abstract only).

"Liquid crystal polymer base for multilayer, high-frequency and flexible PWB"; Electronic Surface Mounting; vol. 7, No. 6, pp. 54-55 (Jun. 1, 1997).

Liquid Crystal Polymer (LCP) Film "Vecstar"; Tadao Yoshikawa; Electronic Parts and Materials; vol. 39, No. 10, pp. 42-46 (Oct. 1, 2000).

"Liquid Crystal Polymer Substrate For Multilayer PWB"; A. Yoshikawa, et al, Proceedings 13th JIEP Annual Meeting, pp. 95-96 (Mar. 3, 1999).

CIRCUITS, MULTI-LAYER CIRCUITS, AND METHODS OF MANUFACTURE THEREOF

CROSS-REFERENCE TO RELATED APPLICATION

This application claims the benefit of U.S. Provisional Application Ser. No. 60/480,111, filed Jun. 19, 2003, which is incorporated by reference herein in its entirety.

BACKGROUND

This invention relates to modified liquid crystalline polymer (LCP) composites, and in particular to liquid crystalline polymer composites useful in the formation of circuit materials, circuits, and multi-layer circuits.

As used herein, a circuit material is an article used in the manufacture of circuits and multi-layer circuits, and includes circuit laminates, bond plies, resin coated conductive layers, and cover films. These circuit materials are each formed from a dielectric composition that can be a thermosetting or thermoplastic polymer. The polymers are often combined with fillers such as silica to adjust the dielectric or other properties of the composition. The dielectric material in a bond ply, resin covered conductive layer, or cover film may be substantially non-flowable, i.e., it softens or flows during manufacture but not use of the circuit, whereas the dielectric material in a circuit laminate (i.e., a dielectric substrate) is designed to not soften or flow during manufacture or use of the circuit or multi-layer circuit. Dielectric substrate materials are further typically divided into two classes, flexible and rigid. Flexible dielectric substrate materials generally tend to be thinner and more bendable than the so-called rigid dielectric materials, which typically comprise a fibrous web and/or other forms of reinforcement, such as short or long fibers or fillers.

A circuit laminate is a type of circuit material that has a conductive layer fixedly attached to a dielectric substrate layer. Double-clad laminates have two conductive layers, one on each side of the dielectric substrate. Patterning a conductive layer of a laminate, for example by etching, provides a circuit. Multi-layer circuits comprise a plurality of conductive layers, at least one of which contains a conductive wiring pattern. Typically, multi-layer circuits are formed by laminating one or more circuits together using bond plies, and, in some cases, resin coated conductive layers, in proper alignment using heat and/or pressure. The bond plies are used to provide adhesion between circuits and/or between a circuit and a conductive layer, or between two conductive layers. In place of a conductive layer bonded to a circuit with a bond ply, the multi-layer circuit may include a resin coated conductive layer bonded directly to the outer layer of a circuit. In such multi-layer structures, after lamination, known hole forming and plating technologies may be used to produce useful electrical pathways between conductive layers.

A variety of polymeric dielectric materials are used in circuit materials, circuits, and multi-layer circuits, including liquid crystalline polymers. There is a growing demand, however, for circuit materials for high performance (high frequency) applications, that is, applications operating at 1 gigahertz (GHz) or higher. High performance applications require, among other things, circuit materials having low dielectric constants for low propagation delay, lower cross talk and higher clock rates, low dissipation factor (Df) for low attenuation, better signal integrity, and lower power consumption in portables. Despite their utility as dielectric materials for circuit boards, liquid crystalline polymers further display a continuous modulus reduction above their glass transition temperature, which results in poor mechanical integrity at high temperatures. This can also result in lowering of copper bond strength, due to the poor cohesive strength of the films at high temperatures. This is not desirable as it causes lifting-off of copper pads during rework operation. There accordingly remains a continuing need in the art for dielectric materials that that meet the ever more stringent standards required for such materials, including acceptable electrical properties such as dielectric constant (Dk) and low dissipation factor, as well as excellent thermomechanical properties.

BRIEF SUMMARY

The above-described drawbacks and disadvantages are alleviated by a dielectric material for use in a circuit material, wherein the dielectric material comprises a liquid crystalline polymer and a polyhedral oligomeric silsesquioxane (POSS) filler. Optionally, the filler is reactive and reacts with LCP during melt compounding. In another embodiment, that the POSS filler acts as a comonomer during solid-state polymerization such that POSS cages are grafted on to the main chain.

In another embodiment, a circuit material comprises a conductive layer disposed on a dielectric layer, wherein the dielectric layer comprises a liquid crystalline polymer and a polyhedral oligomeric silsesquioxane (POSS) filler. An additional conductive layer may be disposed on the opposite side of the dielectric layer to form a double-clad circuit material. Additional circuit layers may be added to make a multi-layer circuit. In another embodiment, the dielectric layer comprises a liquid crystalline polymer, POSS filler, another filler (such as silica), and a fibrous mat.

The liquid crystalline polymer composite dielectric material is economical to make, has a dielectric constant of less than about 3.6 and dissipation factor less than 0.007 and higher mechanical stability at higher temperatures. The above discussed and other features and advantages of the present invention will be appreciated and understood by those skilled in the art from the following detailed description and drawings.

BRIEF DESCRIPTION OF DRAWINGS

Referring now to the exemplary drawings wherein like elements are numbered alike in the several FIGURES.

DETAILED DESCRIPTION

Figure 1:
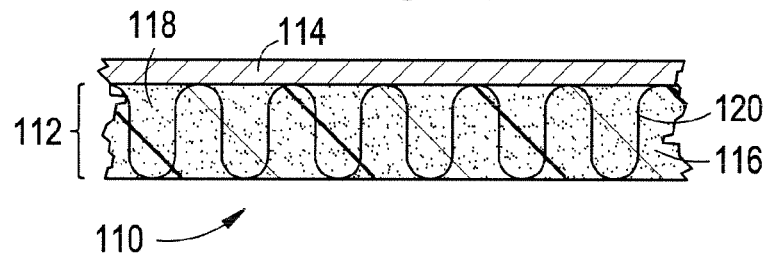
FIG. 1 is a schematic representation of an exemplary circuit material comprising a liquid crystalline polymer dielectric material and a conductive layer.

Use of liquid crystalline polymers together with polyhedral oligomeric silsesquioxane (POSS) fillers either in place of or together with conventional fillers yields improved dielectric materials for circuits. POSS-filled systems typically exhibit lower mass densities and greater stiffness, and are capable of withstanding higher temperatures, as well as higher levels of ionizing radiation. In addition, POSS-filled polymers are capable of wetting fibers and fillers to desirably high degrees. They may also help to minimize polymerization shrinkage, lower viscosity and increase material toughness.

Liquid crystalline polymers are known polymers, and are sometimes described as "rigid-rod," "rod-like," or ordered polymers. These polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements may be present in either the main chain (backbone) of the polymer or in the side chains. When present in the main chain or in the side chains they may be separated by more flexible molecular elements, sometimes referred to as spacers.

Liquid crystalline polymers can be blended with polymers that are not liquid crystalline polymers, hereinafter referred to as non-liquid crystalline polymers. These blends are sometimes referred to as polymer alloys. Some of these blends have processing and functional characteristics similar to liquid crystalline polymers and are thus included within the scope of the present invention. The non-liquid crystalline polymers and liquid crystalline polymer components are generally mixed in a weight ratio of 10:90 to 90:10, preferably in the range of 30:70 to 70:30. Hereinafter the term liquid crystalline polymer will include liquid crystalline polymer blends.

Both thermotropic and lyotropic liquid crystalline polymers are useful. Furthermore, useful liquid crystalline polymers can be thermoplastic or thermosetting. Suitable thermotropic liquid crystalline polymers include liquid crystalline polyesters, liquid crystalline polycarbonates, liquid crystalline polyetheretherketones, liquid crystalline polyetherketoneketones, and liquid crystalline polyester imides, specific examples of which include (wholly) aromatic polyesters, polyester amides, polyamide imides, polyester carbonates, and polyazomethines. Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymers include: (a) at least one aromatic dicarboxylic acid compound, (b) at least one aromatic hydroxy carboxylic acid compound, (c) at least one aromatic diol compound, (d) at least one of an aromatic dithiol ($d_1$), an aromatic thiophenol ($d_2$), and an aromatic thiol carboxylic acid compound ($d_3$), and (e) at least one of an aromatic hydroxyamine compound and an aromatic diamine compound. The monomers may sometimes be used alone, but may frequently be used in a combination of monomers (a) and (c); (a) and (d); (a), (b) and (c); (a), (b) and (e); (a), (b), (c) and (e); or the like.

Examples of the aromatic dicarboxylic acid compound (a) include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl)propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol. Examples of the aromatic thiophenol ($d_2$) include 4-mercaptophenol, 3-mercaptophenol, and 6-mercapto-phenol. Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers may be used either alone or in mixture of at least two thereof. A preferred thermotropic liquid crystalline polymer is 2-naphthalene carboxylic acid, 6-(acetyloxy)-polymer with 4-(acetyloxy) benzoic acid.

Suitable lyotropic liquid crystalline polymers include concentrated sulfuric acid solutions of poly(p-phenylene terephthalamide) (PPTA), silk fibroin aqueous solutions, and sericin aqueous solutions. A PPTA liquid crystalline polymer is represented by the generic Formula below:

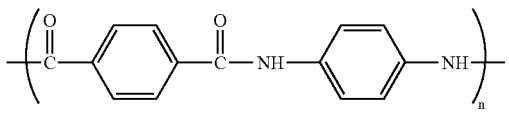

Thermotropic liquid crystalline polymers are prepared from monomer(s) as mentioned above by a variety of esterification methods such as melt acidolysis or slurry polymerization, or the like methods. The molecular weight of the thermotropic liquid crystalline polyester that may favorably be used may be about 2,000 to about 200,000, with about 4,000 to about 100,000 preferred. The measurement of the molecular weight may be done, for example, either through determination of the terminal groups of a compressed film thereof according to infrared spectroscopy, or by gel permeation chromatography (GPC).

The liquid crystalline polymer is combined with at least one polyhedral oligomeric silsesquioxane (POSS) of the generic formula $(RSiO_{1.5})_n$, wherein R is an organic moiety and n is 6, 8, 10, 12, or higher. These molecules have rigid, thermally stable silicon-oxygen frameworks with an oxygen to silicon ratio of 1.5, and covalently-bound organic groups that provide an organic outer layer comprising, for example, hydrocarbons (e.g., phenyl, isooctyl, cyclohexyl, cyclopentyl, isobutyl, or other hydrocarbons), as well as functional groups such as ester, epoxy, acrylate, or other functional groups. POSS typically have surface areas greater than 400 square meters per gram ($m^2$/gm)

The POSS may be incorporated into the liquid crystalline polymer in a variety of ways, for example by copolymerization of a reactive POSS with liquid crystalline monomers or oligomers. Copolymerization with POSS results in the incorporation of filler particles of very small size (average particle diameters of less than 100 nanometers) and dispersion at the molecular level. At this scale, individual polymer chains are stiffened, which results in increased mechanical properties at temperatures higher than the glass transition temperature of LCP.

Copolymerization is by use of functionalized POSS (also known as "POSS monomers"), wherein one, two, or more of the covalently bound organic groups are reactive with at least one monomer or oligomer used to form the liquid crystalline polymer. In some cases, it is possible to have all of the covalently bound organic groups be reactive groups. Copolymerization can be effected under the general reaction conditions described above.

Functionalized POSS may be prepared, for example, by corner-capping an incompletely condensed POSS containing trisilanol groups with a substituted trichlorosilane. For example, the trisilanol functionality of $R_7T_4D_3(OH)_3$ (wherein R is a hydrocarbon group) can be reacted with $Cl_3Si$—Y to produce the fully condensed POSS monomer $R_7T_8Y$. Through variation of the Y group on the silane, a variety of functional groups can be placed off the corner of the POSS framework, including but not limited to halide, alcohol, amine, isocyanate, acid, acid chloride, silanols, silane, acrylate, methacrylate, olefin, and epoxide.

Preferred functional groups are epoxies, esters and acrylate (—X—OC(O)CH=$CH_2$) and methacrylate (—X—OC(O)CH($CH_3$)=$CH_2$) groups, wherein X is a divalent linking group having 1 to about 36 carbons, such as methylene, ethylene, propylene, isopropylene, butylene, isobutylene, phenylene, and the like. X may also be substituted with functional groups such as ether (e.g., —$CH_2CH_2OCH_2CH_2$—), as long as such functional groups do not interfere with formation or use of the POSS. X is preferably propylene, isobutylene, or —$OSi(CH_3)_2$ $CH_2CH_2CH_2$—. One, all, or an intermediate number of the covalently bound groups may be acrylate or methacrylate groups. Such functionalized POSS are available from Gelest, Inc. (Tullytown, Pa.) and Hybrid Plastics. A methacryloxypropyl-substituted $T_8$ POSS (wherein all positions of the polyhedron are methacryloxypropyl-substituted) is available under the trade designation MA0735 from Hybrid Plastics Corp.). Another methacryloxypropyl-substituted $T_8$ POSS (wherein one position is methacryloxypropyl-substituted and the remaining positions are isobutyl-substituted) is available under the trade designation MA0702 from Hybrid Plastics Corp (Fountain Valley, Calif.).

The linking groups X may also be functionalized with other functional groups. Other POSS fillers include, for example $T_6$, $T_8$, $T_{10}$, or $T_{12}$ structures functionalized with alkoxysilanes such as diethoxymethylsilylethyl, diethoxymethylsilylpropyl, ethoxydimethylsilylethyl, ethoxydimethylsilylpropyl, triethoxysilylethyl, and the like; with styrene, such as styrenyl ($C_6H_5CH$=CH—), styryl (—$C_6H_4CH$=$CH_2$) and the like; with olefins such as allyl, —$OSi(CH_3)_2CH_2CH_2$=$CH_2$, cyclohexenylethyl, —OSi $(CH_2)_2CH$=$CH_2$ and the like; with epoxies, such as 4-propyl-1,2-epoxycyclohexyl, 3-propoxy, glycidyl (—$CH_2CH_2CH_2OCH_2CH(O)CH_2$), and the like; with chlorosilanes such as chlorosilylethyl, dichlorosilylethyl, trichlorosilylethyl, and the like; with amines such as aminopropyl, aminoethylaminopropyl, and the like; with alcohols and phenols such as —$OSi(CH_3)_2CH_2CH_2CH_2OC(CH_2CH_3)_2$ ($CH_2CH_2OH$), 4-propylene-trans-1,2-cyclohexanediol, —$CH_2CH_2CH_2OCH_2C(CH_2OH)(OH)$, and the like; with phosphines such as diphenylphosphinoethyl, diphenylphosphinopropyl, and the like; with norbornenyls such as norbornenylethyl; with nitriles such as cyanoethyl, cyanopropyl, —$OSi(CH_3)_2CH_2CH_2CH_2CN$, and the like; with isocyanates such as isocyanatopropyl, —$OSi(CH_3)_2$ $CH_2CH_2CH_2NCO$, and the like, with halides such as 3-chloropropyl, chlorobenzyl (—$C_6H_4CH_2Cl$), chlorobenzylethyl, 4-chlorophenyl, trifluoropropyl (including a $T_8$ cube with eight trifluoropropyl substitutions) and the like; and with esters, such as ethyl undecanoat-1-yl and methyl propionat-1-yl, and the like. Certain polymers such as poly(dimethylcomethylhydrido-co-methylpropyl polymers, poly(dimethyl-comethylvinyl-co-methylethylsiloxy, poly (ethylnorbonenyl-co-norbonene) and poly (ethylsilsesquioxan) may also be used to functionalize POSS. Many of these substitutions are commercially available on $T_8$ POSS from Hybrid Plastics.

In another embodiment, the POSS filler may be incorporated into the liquid crystalline polymer by reactive or non-reactive blending. Use of functionalized POSS as described above under suitable conditions, for example in the presence of a cure system, can result in reactive blending, wherein at least one covalent bond is formed between the POSS and the liquid crystalline polymer. Without being bound by theory, it is hypothesized that reactive blending allows for better dispersion in and reactivity with the liquid crystalline polymers, which reduces moisture uptake, as well as volumetric shrinkage.

Suitable liquid crystalline polymers for blending or reactive blending include, for example those available under the trade name VECTRA®, commercially available from Ticona; XYDAR®, commercially available from Solvay Polymers; ZENITE®, commercially available from DuPont; TITAN, commercially available from Eastman; and SUMI- KASUPER, commercially available from Sumitomo Chemical Company, among others. Liquid crystalline polymers formed by copolymerization with POSS may also be used. The liquid crystalline polymers and polymer blends described hereinabove are meant for illustration and not for limitation, as many other suitable liquid crystalline polymers and polymer blends are known in the art. Likewise, it is recognized that compatibilizers, plasticizers, flame retardant agents, and other additives may be contained in the liquid crystalline polymers.

The amount of liquid crystalline polymer in the composite may vary widely, from about 1 to about 95 weight percent (wt. %) of the composite, depending on the particular polymer, POSS, and desired properties. Suitable amounts further include less than or equal to about 80 weight percent (wt %), preferably less than or equal to about 60 wt %, and more preferably less than or equal to about 50 wt %, based on the total weight of the dielectric material. The amount of liquid crystalline polymer is generally greater than or equal to about 20 wt %, preferably greater than or equal to about 30 wt %, and more preferably greater than or equal to about 40 wt %, based on the total weight of the dielectric material.

In addition to the POSS, the liquid crystalline polymer composition may comprise one or more other dielectric particulate fillers. Useful particulate fillers include, but are not limited to, titanium dioxide (rutile and anatase), barium titanate, strontium titanate, silica (particles and hollow spheres) including fused amorphous silica and fumed silica; corundum, wollastonite, aramide fibers (e.g., KEVLAR from DuPont), fiberglass, $Ba_2Ti_9O_{20}$, glass spheres, quartz, boron nitride, aluminum nitride, silicon carbide, beryllia, alumina, and magnesia. The particulate fillers may be used alone or in combination.

Particularly preferred particulate fillers are rutile titanium dioxide and amorphous silica because these fillers have a high and low dielectric constant, respectively, thereby permitting a broad range of dielectric constants combined with a low dissipation factor to be achieved in the final product by adjusting the respective amounts of the two fillers in the composition. To improve adhesion between the fillers and liquid crystalline polymer, coupling agents, e.g., silanes, may be used.

The total amount of filler is typically less than or equal to about 70 wt %, preferably less than or equal to about 60 wt %, and more preferably less than or equal to about 50 wt %, based on the total weight of the liquid crystalline polymer dielectric material. In addition, the total amount of particulate filler is greater than or equal to about 10 wt %, preferably greater than or equal to about 20 wt %, and more preferably greater than or equal to about 30 wt %, based on the total weight of the liquid crystalline polymer dielectric. Depending on the desired properties, the amount of POSS (excluding any POSS copolymerized with the LCP) may comprise 100 wt % of the filler composition, less than 99 wt %, less than 80 wt %, or less than 60 wt %. The POSS may also comprise more than 1 wt % of the filler composition, more than 20 wt %, or more than 40 wt % of the total filler composition.

Particularly when used as a dielectric substrate, the liquid crystalline polymer dielectric composition may further comprise a fibrous web, which is herein defined as a woven or non-woven assemblage of fibers capable of withstanding the processing conditions involved in the formation of the liquid crystalline polymer composite, circuit board materials, and circuits formed therefrom. The fibrous web comprises thermally stable webs of a suitable fiber, preferably glass (E, S, and D glass) or high temperature polymer fibers (e.g., KODEL polyester from Eastman Kodak) or polyphenylene sulfide fiber from Phillips Petroleum. Such thermally stable fiber reinforcement provides the composite with the desired structural rigidity. In addition, the use of the fibrous web renders a liquid crystalline polymer composite with a relatively high mechanical strength.

Preferred examples of the fibrous web are set forth in the following Table:

TABLE 1

| Manufacturer | Style | Thickness (inches) |
|---|---|---|
| Fiber Glast | 519-A | 0.0015 |
| Hexcel-Schwebel | 1674 | 0.0045 |
| Hexcel-Schwebel | 1080 | 0.0025 |
| BGF | 106 | 0.0015 |
| BGF | 7628 | 0.0069 |

Generally, the fibrous web is present in an amount that is less than or equal to about 50 wt %, preferably less than or equal to about 40 wt %, and more preferably less than or equal to about 30 wt %, based on the total weight of the liquid crystalline polymer composite. Alternatively, the amount of fibrous web is greater than or equal to about 10 wt %, preferably greater than or equal to about 15 wt %, and more preferably greater than or equal to about 20 wt %, based on the total weight of the liquid crystalline polymer composite. The thickness of the liquid crystalline polymer composite is preferably about 1 to about 120 mils (about 0.025 to about 3.05 millimeters).

In general, the liquid crystalline polymer dielectric materials (with or without copolymerized POSS) are processed by melt blending the liquid crystalline polymer with the POSS filler during manufacture of LCP pellets, or during manufacture of LCP film, optionally followed by heating of the LCP and functionalized POSS to induce reaction. For example, the liquid crystalline polymer with or without POSS, any particulate fillers, and any optional components, e.g., coupling agents, silanes, or the like, are thoroughly mixed to form an intimate blend in conventional mixing equipment, preferably in melt. The mixing temperature is regulated to avoid substantial decomposition, crosslinking, or other reaction of the components. Mixing continues until the particulate filler is uniformly dispersed throughout the liquid crystalline polymer. The particulate filler may be pretreated with coupling agents (preferably silanes) in a separate step for more efficient use of the agents.

The blend can then be formed into a film or sheet by methods known in the art, for example extrusion or casting. The liquid crystalline polymer/particulate filler film is then combined with the fibrous web, e.g., a glass cloth, to form the liquid crystalline polymer composite. The methods of combining the glass cloth and the liquid crystalline polymer/particulate filler are various and include, but are not limited to, co-extrusion, lamination, and powder coating followed by heating to a temperature under pressure to allow the liquid crystalline polymer to flow into the interfiber spaces of the glass cloth.

Useful conductive layers for the formation of circuit materials, circuits, and multi-layer circuits include stainless steel, copper, aluminum, zinc, iron, transition metals, and alloys comprising at least one of the foregoing, with copper preferred. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers with about 9 micrometers to about 180 micrometers especially preferred. When two or more conductive layers are present, the thickness of the two layers may be the same or different.

Copper conductive layers are preferred. The copper conductive layer can be treated to increase surface area, treated with a stabilizer to prevent oxidation of the conductive layer (i.e., stainproofing), or treated to form a thermal barrier. Both low and high roughness copper conductive layers treated with zinc or zinc alloy thermal barriers are particularly useful, and may further optionally comprise a stainproofing layer. Such copper conductive layers are available from, for examples, Circuit Foil, USA under the trade names "TWX" and "TW", Oak-Mitsui under the tradename "TOB", Circuit Foil Luxembourg under the tradename "TWS", and Gould Electronics under the tradename "JTCS". Other suitable copper conductive layers are available from Yates Foil under the trade name "TAX"; from Circuit Foil Luxembourg under the trade name "NT TOR"; from Co-Tech Copper Foil Company under the trade name "TAX"; and from Chang Chun Petrochemical Company under the trade name "PINK."

As previously stated, the liquid crystalline polymer composite is useful as a dielectric material for use in forming circuit materials, such as laminates, bond plies, and resin coated conductive layers, all or some of which may be used to form circuits and multi-layer circuits. Depending on the degree of flowability of the dielectric material, the dielectric material may be used to form a dielectric substrate, for substantially non-flowable dielectric such as is found in a resin coated conductive layer, or a flowable dielectric such as a bond ply. Dielectric substrates are characterized by a substantially low degree of flowability during circuit manufacture and use. It is contemplated that dielectric materials comprising materials other than those disclosed herein may be used in combination with the dielectric materials disclosed herein to form circuit materials, circuits and multi-layer circuits.

When using a batch wise or semi-continuous process, at least one layer of the liquid crystalline polymer composite, and any desired optional additional layers used to form the circuit or multi-layer circuit are arranged in a desired order to form a stack. The stack is then placed in a press, which may or may not be evacuated to form a vacuum. In a typical press-cycle, the temperature is increased at a rate of about 2 to about 10° C./minute. Once the temperature reaches the desired lamination temperature the pressure is increased to about 2 to about 3 MegaPascal (MPa). While the desired temperature depends upon the composition of the dielectric material, the temperature is typically about 200° C. to about 350° C. The stack is held at the desired temperature and pressure for a time sufficient to adhere the layers, about 5 to about 45 minutes. The resulting article is then cooled while maintaining the desired pressure. The article may be removed from the press when the temperature is about 100° C. or lower, and stored until used.

A first exemplary embodiment is shown in FIG. 1, wherein a conductive layer 114 is disposed on a dielectric substrate 112 to form a circuit material 110. As used herein and throughout the disclosure, "disposed" means that the layers are in contact and partially or wholly cover each other. The dielectric substrate 112 comprises a liquid crystalline polymer 116, POSS 118, and optionally a woven web 120. Alternatively, the woven web 120 may be substituted for a non-woven assemblage (not shown), or may be absent. A single clad circuit laminate is provided when dielectric material 112 is substantially non-flowable, (i.e. a dielectric substrate) and a resin covered conductive layer is provided when dielectric material 112 is flowable during circuit manufacture, e.g., during lamination. Additionally, conductive layer 114 may be in the form of a circuit layer (not shown) to form a single clad circuit.

Figure 2:
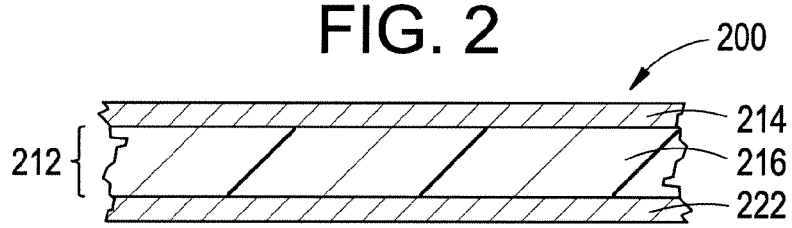
FIG. 2 is a schematic representation of a double clad circuit laminate.

A second exemplary embodiment is shown in FIG. 2, wherein a double clad circuit laminate 200 comprises a dielectric substrate 212 disposed between two conductive layers 214, 222. Dielectric substrate 212 comprises a liquid crystalline polymer 216, which has been reacted with POSS to provide a covalent bond between the polymer and the POSS (not shown). Alternatively, a woven or non-woven web (not shown) may be present to provide a rigid circuit laminate. Additional filler (not shown) may also be present. Additionally, one or both conductive layers 214, 222 may be in the form of a circuit (not shown) to form a double clad circuit (not shown).

Figure 3:
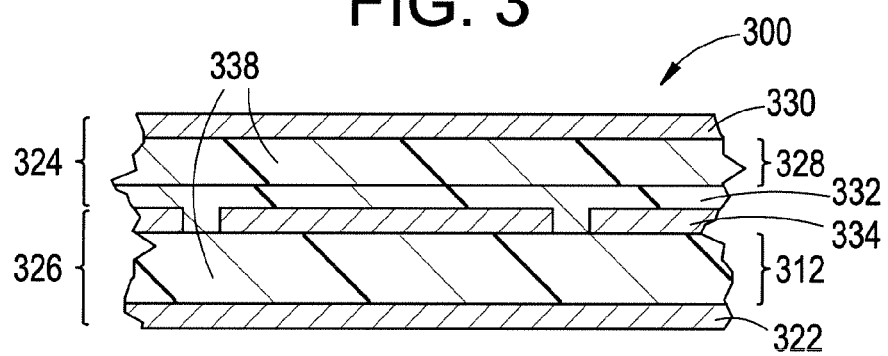
FIG. 3 is a schematic representation of an exemplary multi-layer circuit.

A third exemplary embodiment is shown in FIG. 3. FIG. 3 shows a multi-layer circuit 300 comprising a resin coated conductive layer 324 disposed on a double clad circuit 326. The resin coated conductive layer 324 comprises a substantially non-flowable dielectric material 328 disposed between a conductive layer 330 and a flowable dielectric material 332. Double clad circuit 326 comprises a dielectric substrate 312 disposed between a circuit layer 334 and a conductive layer 322. Dielectric substrate 312 includes liquid crystalline polymer 338 covalently bound to POSS. A woven or non-woven reinforcing material may be present in substrate 312 (not shown). Flowable dielectric material 332 is disposed on a side of circuit layer 334 opposite to dielectric substrate 312. Flowable dielectric material 332 comprises a dielectric material that does not contain any additives that would hinder flow. Additionally, substantially non-flowable dielectric material 328 may comprise particulate filler and/or a woven or nonwoven web (not shown) in amounts that may be less than, equal to, or greater than the amounts used in dielectric substrate 312.

Figure 4:
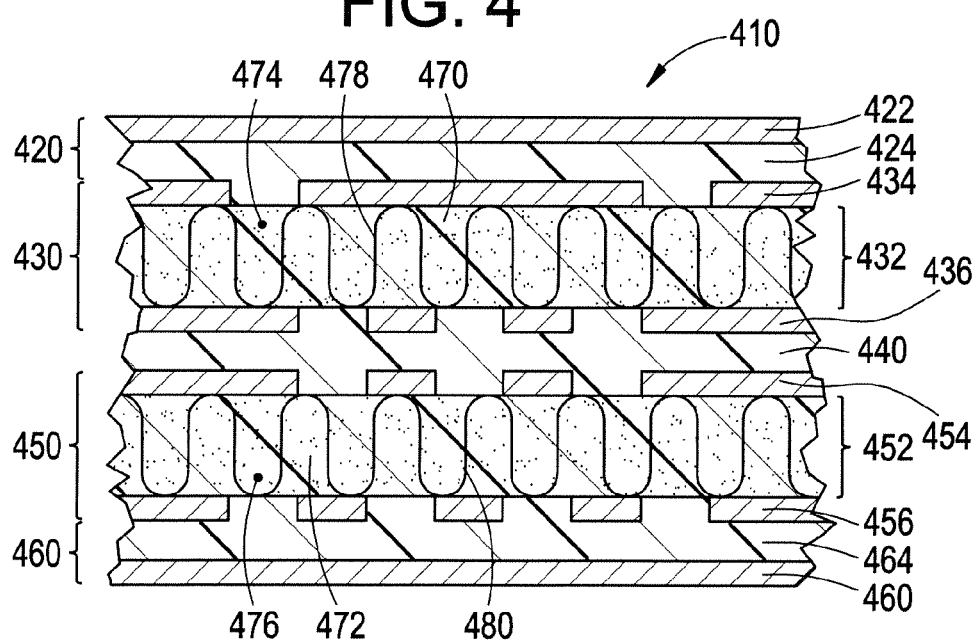
FIG. 4 is a schematic representation of another exemplary multi-layer circuit.

Another exemplary embodiment is shown in FIG. 4. FIG. 4 depicts a multi-layer circuit 410 comprising a first resin coated conductive layer 420, a first double clad circuit 430, a bond ply 440, a second double clad circuit 450, and a second resin coated conductive layer 460.

First double clad circuit 430 comprises a first dielectric substrate 432 disposed between a first circuit layer 434 and a second circuit layer 436. Second double clad circuit 450 comprises a second dielectric substrate 452 disposed between a third circuit layer 454 and a fourth circuit layer 456. At least one, and preferably both of first and second dielectric substrates 432, 452 comprises a liquid crystalline polymer 470, 472, covalently bound to a POSS. First and/or second dielectric substrates 432, 452 further comprise particulate filler 474, 476 and a fibrous web 478, 480.

First resin coated conductive layer 420 comprises a first conductive layer 422 and a first resinous layer 424. Second resin coated conductive layer 460 comprises a second conductive layer 462 and a second resinous layer 464. In another embodiment, first resinous layer 424, second resinous layer 464 and bond ply 440 comprises a liquid crystalline polymer.

It is to be understood that the above-described circuit materials are exemplary only, and other configurations are possible, including configurations comprising additional layers. Other materials may be used in the formation of the circuit materials. In one preferred embodiment, however, all dielectric substrates comprise a liquid crystalline polymer covalently bound to a POSS.

Liquid crystalline polymer dielectric material comprising POSS filler is economical to make, and has acceptable dielectric properties, that is, a dielectric constant of less than about 3.8 and a dissipation factor of less than about 0.007, each measured at frequencies from 1 to 10 gigahertz. The polymers further have higher mechanical stability at higher temperatures, for example above about 100° C., preferably above about 150° C. The polymers may fursther have an increase in glass transition temperature.

In one embodiment the polymers have lower z-axis coefficient of thermal expansion (CTE), preferably less than about 200 ppm, more preferably less than about 100 ppm measured over the range of −100 to 250° C. In another embodiment, use of POSS imparts isotropy to the liquid crystalline polymer layers without biaxial stretching. For example, the x-axis and y-axis of films comprising the liquid crystalline polymer and POSS may have a coefficient of thermal expansion within 20 ppm of each other, preferably within 15 ppm, more preferably within 10 ppm, and even more preferably within 5 ppm measured over the range of−100 to 250° C.

In still another embodiment, the storage modulus

These properties lead to improved fabrication characteristics, particularly during drilling and/or plating.

The invention is illustrated by the following non-limiting examples.

EXAMPLE 1

Liquid crystalline polymer resin such as Vectra A, available from Ticona, POSS, particulate filler (10-micrometer fused silica, available from MINCO or CE Minerals), are thoroughly mixed to form an intimate blend in conventional mixing equipment, preferably in melt. The mixing temperature is regulated to avoid substantial decomposition, crosslinking, or other reaction of the components. Mixing continues until the POSS and particulate filler are uniformly dispersed throughout the liquid crystalline polymer, and formed into a layer by known processes. The liquid crystalline polymer composite is placed against the Cu foil (½-ounce copper such as NT-TOR from Circuit Foil). The laminate is processed by applying heat up to 564° F. at a rate of 5° F./min while under 250 pounds per square inch (psi) pressure. Once the press reaches 564° F., the pressure is increased to 400 psi and the condition is maintained for 15 min. When the dwell is complete, the press is cooled to 200° F. at a rate of 5° F./min while maintaining 400 psi. The laminate has acceptable physical properties for use as a circuit board.

EXAMPLE 2

Liquid crystalline polymer resin such as Vectra A, available from Ticona, functionalized POSS (preferably an acrylate ester-functionalized POSS, and particulate filler (10-micrometer fused silica, available from MINCO or CE Minerals), are thoroughly mixed, for example in a high-shear, high-intensive mixer such as a Haake mixer, to form an intimate blend in conventional mixing equipment, preferably in melt. Mixing continues until the POSS and particulate filler are uniformly dispersed throughout the liquid crystalline polymer, and at a temperature effective to result in reaction (e.g., transesterification) between the functionalized POSS and the liquid crystalline polymer. The composite is formed into a layer by known processes. The liquid crystalline polymer composite is placed against the Cu foil (½-ounce copper such as NT-TOR from Circuit Foil). The laminate is processed by applying heat up to 500–600° F. at a rate of, e.g., 5° F./min while under pressure, for example 250 pounds per square inch (psi). Once the press reaches the target lamination temperature, the pressure is increased, for example to 400 psi and the condition is maintained for a time effective to complete lamination, e.g., 15 minutes. When the dwell is complete, the press is cooled, for example to 200° F. at a rate of 5° F./min while maintaining 400 psi. If reaction with the POSS is not completed during mixing and/or lamination, it may be completed by an optional post-baking step before and/or after lamination. The laminate has acceptable physical properties for use as a circuit board.

EXAMPLE 3

POSS may be incorporated into the liquid crystalline polymer by copolymerization. For example, p-acetoxybenzoic acid, 6-acetoxy-2-naphthoic acid, and a copolymerizable POSS (e.g., one having a hydroxyl and a carboxylic acid functionality) are charged to a three-necked round bottomed flask equipped with a stirrer, argon inlet tube, and a heating tape-wrapped distillation head connected to a condenser. The charged flask is vacuum purged with argon three times and brought to reaction temperature, e.g., 250° C., and stirred under a slow stream of argon while acetic acid is distilled from the polymerization vessel. The temperature of the reaction is adjusted to complete the reaction, e.g., to 320° C., and may then be subjected to a series of reduced pressure stages, where the viscosity of the polymer increases. Upon cooling, the polymer plug is finely ground and dried, e.g., in a forced air oven at 150° C. for about an hour. The resin may then be used in the formation of a circuit laminate.

While preferred embodiments have been shown and described, various modifications and substitutions may be made thereto without departing from the spirit and scope of the invention. Accordingly, it is to be understood that the present invention has been described by way of illustration and not limitations.

What is claimed is:

1. A circuit material for the formation of circuits or multi-layer circuits, the circuit material comprising a liquid crystalline polymer covalently bonded to a POSS; wherein the circuit material has a dielectric constant of less than about 3.8 and a dissipation factor of less than or equal to about 0.007 when measured over 1 to 10 GHz.

2. A circuit material for the formation of circuits or multi-layer circuits, the circuit material comprising
   a first conductive layer; and
   a dielectric layer disposed on the first conductive layer, wherein the dielectric layer comprises a liquid crystalline polymer covalently bonded to a POSS; wherein the circuit material has a dielectric constant of less than about 3.8 and a dissipation factor of less than or equal to about 0.007 when measured from 1 to 10 GHz.

3. The circuit material of claim 1, wherein the liquid crystalline polymer further comprises a particulate filler, a fibrous web, or a combination comprising at least one of the foregoing.

4. The circuit material of claim 1, wherein the liquid crystalline polymer composition is flowable at temperatures greater than about 200° C.

5. The circuit material of claim 2, further comprising a second conductive layer disposed on the dielectric layer on a side opposite the first conductive layer.

6. The circuit material of claim 1, wherein the POSS is of the generic formula $(RSiO_{1.5})_n$, wherein R is an organic moiety and n is 6, 8, 10, 12, or higher.

7. The circuit material of claim 6, wherein the organic moiety is the same or different, and is a hydrocarbon or comprises a functional group selected from the group consisting of epoxy, hydroxy, ester, acrylate and a combination comprising at least one of the foregoing groups.

8. The circuit material of claim 1, wherein the covalent bonding is provided by a functionalized divalent linking group having 1 to about 36 carbon atoms.

9. The circuit material of claim 8, wherein the divalent linking group comprises an alkylene group, a dialkylene ether group, a trialkylsilyloxy group, or a combination comprising at least one of the foregoing groups.

10. A dielectric material for a circuit material, circuit, or multi-layer circuit, comprising a liquid crystalline polymer covalently bonded to a POSS; wherein the circuit material has a dielectric constant of less than about 3.8 and a dissipation factor of less than or equal to about 0.007 when measured from 1 to 10 GHz.

11. A circuit comprising the circuit material of claim 1.

12. A multi-layer circuit comprising the circuit material of claim 1.

* * * * *